United States Patent
Lambert

(10) Patent No.: US 9,323,026 B2
(45) Date of Patent: Apr. 26, 2016

(54) OPTICAL ARRANGEMENT, OPTICAL MODULE, AND METHOD FOR CORRECTLY POSITIONING AN OPTICAL MODULE IN A HOUSING

(71) Applicant: TRUMPF Lasersystems for Semiconductor Manufacturing GmbH, Ditzingen (DE)

(72) Inventor: Martin Lambert, Korb (DE)

(73) Assignee: TRUMPF Lasersystems for Semiconductor Manufacturing GmbH, Ditzingen (DE)

( * ) Notice: Subject to any disclaimer, the term of this patent is extended or adjusted under 35 U.S.C. 154(b) by 101 days.

(21) Appl. No.: 13/833,551

(22) Filed: Mar. 15, 2013

(65) Prior Publication Data
US 2014/0043676 A1 Feb. 13, 2014

Related U.S. Application Data

(63) Continuation of application No. PCT/EP2012/065800, filed on Aug. 13, 2012.

(51) Int. Cl.
*G06K 7/10* (2006.01)
*G02B 26/08* (2006.01)
(Continued)

(52) U.S. Cl.
CPC .............. *G02B 7/1822* (2013.01); *G02B 7/182* (2013.01); *G02B 27/0006* (2013.01); *G03F 7/70825* (2013.01); *G03F 7/70833* (2013.01); *G03F 7/70891* (2013.01); *G03F 7/70975* (2013.01)

(58) Field of Classification Search
CPC ...... G02B 7/005; G02B 7/1822; G02B 7/182; G02B 27/0006; G03F 7/70825; G03F 7/70833; G03F 7/70891; G03F 7/70975

USPC .......... 359/350, 857, 514, 198.1, 221.2, 543, 359/819, 281–295, 702–704, 821–828; 378/34; 850/1; 29/25.35; 310/329; 335/215; 356/482, 496; 361/234
See application file for complete search history.

(56) References Cited

U.S. PATENT DOCUMENTS

| 5,638,223 A * | 6/1997 | Ikeda ........................... 359/827 |
| 8,173,985 B2 | 5/2012 | Bergstedt et al. |
| 2010/0026976 A1 | 2/2010 | Meehan et al. |
| 2010/0051832 A1* | 3/2010 | Nishisaka et al. ........ 250/504 R |
| 2010/0115671 A1* | 5/2010 | Pryadkin et al. .................. 850/1 |

(Continued)

OTHER PUBLICATIONS

Notification of Transmittal of Translation of the International Preliminary Report on Patentability and Written Opinion for corresponding PCT Application No. PCT/EP2012/065800, mailed Feb. 25, 2015, 12 pages.

*Primary Examiner* — Scott J Sugarman
*Assistant Examiner* — Mustak Choudhury
(74) *Attorney, Agent, or Firm* — Fish & Richardson P.C.

(57) ABSTRACT

The invention relates to an optical arrangement comprising an optical module having a first carrier body to which there are attached at least one optical element and a plurality of first mounting elements, and a housing having a second carrier body for at least one further optical element, wherein a plurality of second mounting elements is attached to the carrier body. Also comprised is a movement device for displacing the first carrier body relative to the second carrier body in a movement direction between a removal position from which the optical module can be removed from the housing and a mounting position in which the movement device presses the first mounting elements against the second mounting elements. The invention relates also to an optical module and to a method for correctly positioning an optical module in a housing.

15 Claims, 3 Drawing Sheets

(51) Int. Cl.
   *G02B 26/10*  (2006.01)
   *G02B 26/12*  (2006.01)
   *G02B 7/182*  (2006.01)
   *G02B 27/00*  (2006.01)
   *G03F 7/20*   (2006.01)

(56) References Cited

U.S. PATENT DOCUMENTS

2010/0208230 A1   8/2010   Rath et al.
2011/0194091 A1*  8/2011   Kwan et al. .................... 355/67

* cited by examiner

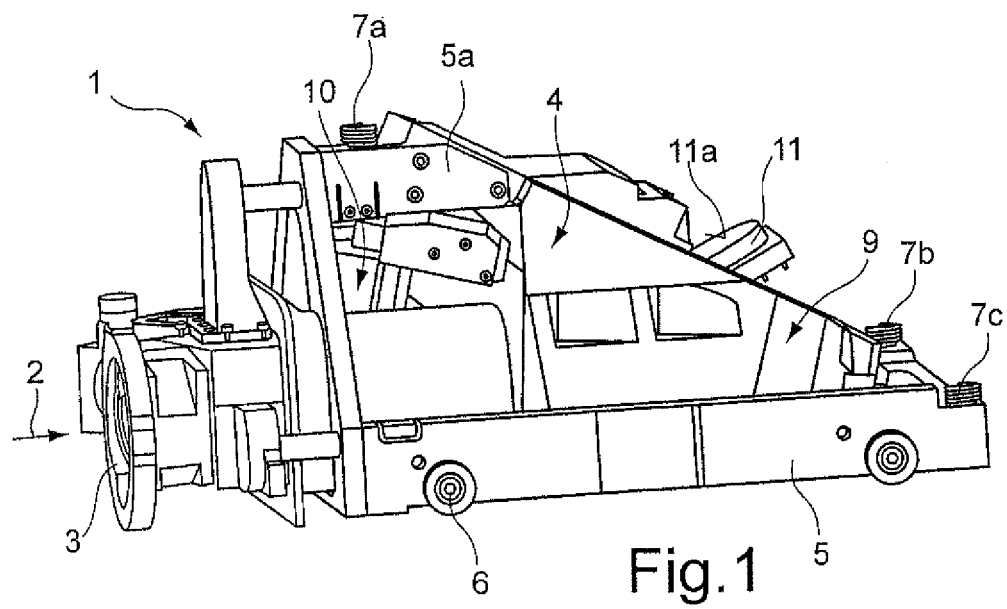
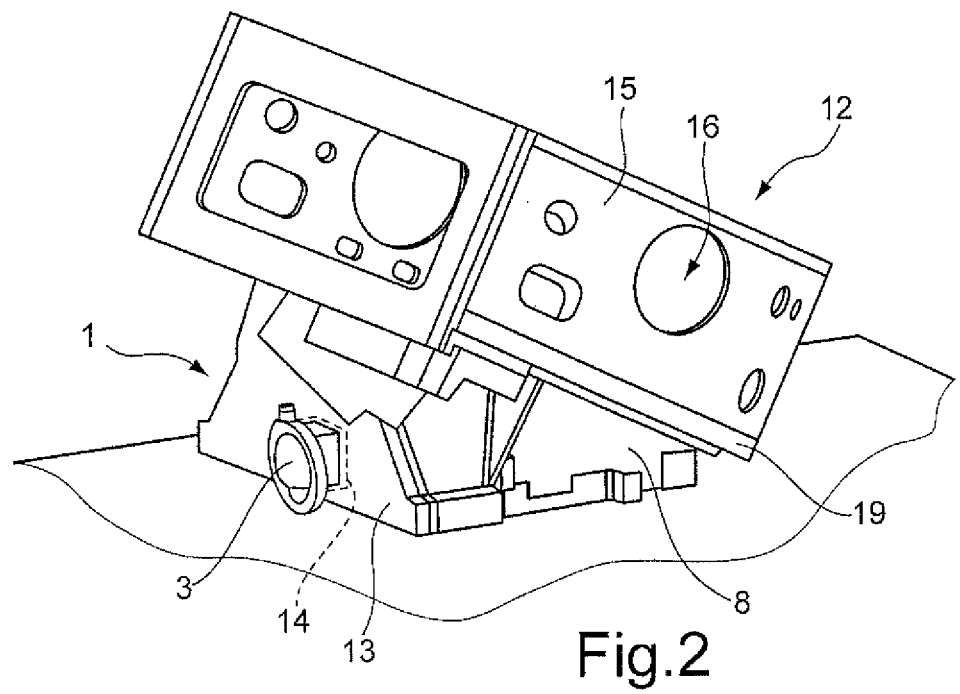

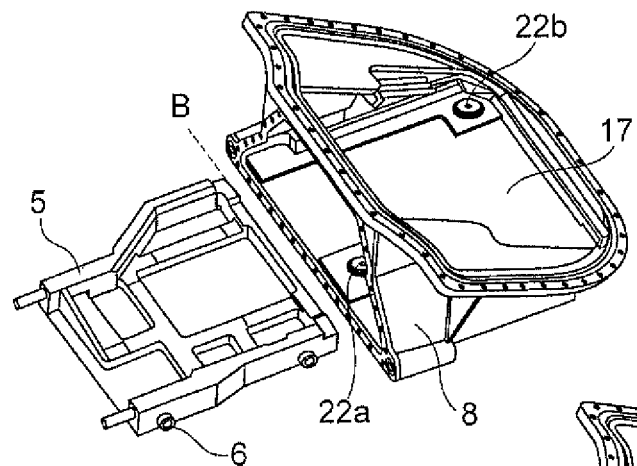
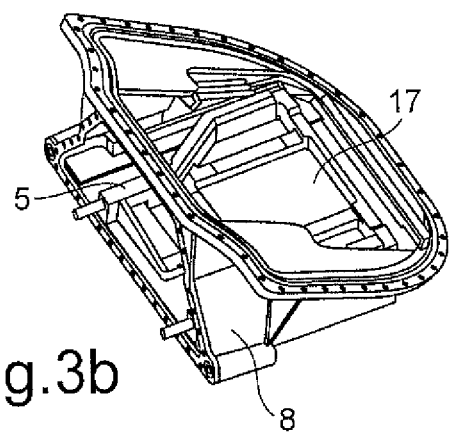
Fig.3a
Fig.3b
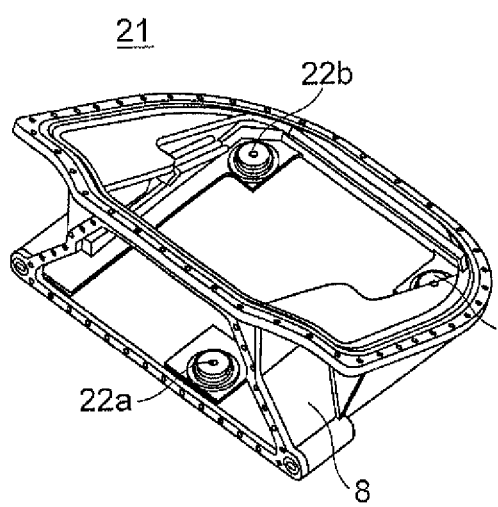
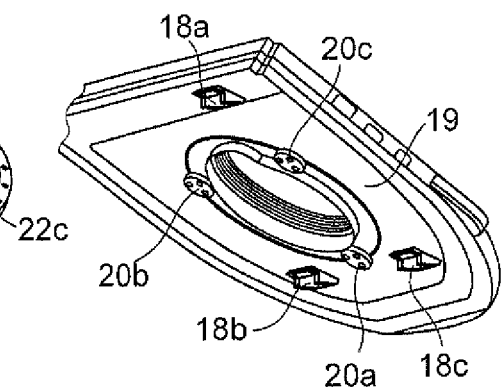
Fig.4a  Fig.4b

OPTICAL ARRANGEMENT, OPTICAL MODULE, AND METHOD FOR CORRECTLY POSITIONING AN OPTICAL MODULE IN A HOUSING

CROSS REFERENCE TO RELATED APPLICATION

This application is a continuation of and claims priority under 35 U.S.C. §120 to PCT Application No. PCT/EP2012/065800 filed on Aug. 13, 2012. The contents of this priority application are hereby incorporated by reference in its entirety.

TECHNICAL FIELD

This invention relates to optical arrangements as well as optical modules and methods for correctly positioning an optical module in a housing.

BACKGROUND

During operation, optical elements or optical assembly groups in optical arrangements can become contaminated when contaminating substances are deposited on their optical surfaces. This problem occurs in an Extreme Ultra-Violet (EUV) lithography systems, in which for the generation of EUV radiation a laser beam of a drive laser system is directed at a target position of a target material. The target material is converted to a plasma state when irradiated with the laser beam and thereby emits EUV radiation. Such an EUV lithography system is described, for example, in U.S. Pat. No. 8,173,985 B2. Upon irradiation with the laser beam, a portion of the target material (e.g., tin) is typically vaporized and is deposited on the optical surfaces of optical elements arranged in the vicinity of the target position.

To counteract this problem, a CO2 laser is generally used as the drive laser of such an optical arrangement. Owing to its long wavelength of about 10.6 micrometers, CO2 laser radiation is also reflected by reflective optical elements which have a comparatively rough optical surface, as is caused by tin deposits. In the case of some target materials, for example tin, the use of a drive laser in the form of a CO2 laser additionally permits a high conversion efficiency between the input power of the drive laser and the output power of the EUV radiation.

In the above-described EUV lithography system, and also in other optical arrangements, it may from time to time be necessary to carry out maintenance work on the optical elements or the optical assembly groups, for example to clean the optical elements or replace them with uncontaminated optical elements. If an optical assembly group is arranged in a closed housing (e.g., in a vacuum housing), it can generally only be dismantled with a relatively high outlay. If direct access to the optical assembly group, for example by maintenance openings, is not possible due to the available space, it is necessary to remove the optical module or the optical assembly group from the housing to carry out the maintenance work.

Removing the optical module from the housing gives rise to the problem that, when the maintenance work is complete the optical module (more precisely the optical elements of the optical module) must be re-positioned with high accuracy relative to the optical elements that have remained in the housing. In the case of a vacuum housing, there may also be deformation of the housing walls caused by the vacuum, which makes correct positioning of the optical elements, or of the optical module, more difficult. A complex and tedious adjustment is therefore typically necessary for the correct positioning of the optical elements of the optical module when the maintenance work is complete.

The EUV radiation generated in an optical arrangement is fed to an illumination system (not shown) to illuminate as homogeneously as possible an image field on which a structured element (mask) is arranged. A projection system (also not shown) serves to reproduce the structure of the mask on a light-sensitive substrate (wafer). The beam-generation system, the illumination system and the projection system together form an EUV lithography apparatus for the structuring of the light-sensitive substrate (wafer).

The system and methods described herein can advantageously provide an optical arrangement having an optical module and a housing which facilitate the correct positioning of the optical elements of the optical module in the housing.

SUMMARY

An optical arrangement is provided comprising an optical module having a first carrier body to which there are attached an optical element, in particular a reflective optical element, and a plurality of first mounting elements, a housing, in particular a vacuum housing, having a second carrier body for at least one further, in particular reflective, optical element, wherein a plurality of second mounting elements is attached to the carrier body, and also a movement device for displacing the first carrier body relative to the second carrier body in a movement direction, in particular a vertical movement direction, between a removal position, from which the optical module can be removed from the housing, and a mounting position, in which the movement device presses the first mounting elements against the second mounting elements.

The pressing of the first mounting elements against the second mounting elements in the mounting position makes it possible to produce a reproducible, correct positioning of the at least one optical element of the optical module relative to at least one optical element which is attached in the (vacuum) housing to the second carrier body, without a complex adjustment being necessary for that purpose. By attaching the mounting elements to the carrier bodies it is additionally possible to create a carrier structure inside the housing for mounting the optical elements, which has been found to be advantageous in particular in the case of vacuum housings. The carrier body of the optical module and the optical elements rigidly connected thereto are statically determined by the mounting on at least three pairs of mounting elements and are accordingly mounted reproducibly in the housing.

In the mounting position, the optical module can typically not be removed from the housing, because the mounting elements are in engagement with one another, or the mounting surfaces abut one another. To remove the optical element from the housing, it is moved from the mounting position into a removal position, in which the mounting elements are no longer in engagement with one another and sufficient space is available for the removal. The movement direction (and accordingly also the contact direction of the mounting elements) can extend in a vertical direction to ensure an arrangement that is free of lateral forces.

The removal position can be beneath the mounting position. In that case, during operation of the optical arrangement, the movement device presses the mounting elements of the optical module against the force of gravity upwards against the mounting elements of the stationary carrier body. To move the carrier body from the mounting position into the removal position, the carrier body is lowered by the movement device. The movement path of the optical module between the removal position and the mounting position can be a few millimeters. Removal of the optical module from the housing starting from the removal position can take place by a displacement movement (e.g., in the horizontal direction).

In one embodiment, the carrier body comprises a carrier slide which is provided with a plurality of rollers and/or sliding elements. By the rollers, the carrier slide can in a simple manner be displaced, or rolled, starting from the removal position, along a support surface of the housing which typically extends horizontally, as a result of which the removal of the optical module from the housing is facilitated. As soon as one of the rollers loses contact with the housing during the displacement movement, the weight of the optical module can be taken by additional supporting rollers, guide rods and/or by an auxiliary surface which is adjacent to the support surface of the housing. The use of sliding elements, for example in the form of runners, is also possible.

In a further development of this embodiment, the rollers and/or the sliding elements rest on a support surface on the housing in the removal position and are at a distance from the support surface in the mounting position. From the removal position, the optical module can be displaced by the rollers or sliding elements along the support surface, which typically extends horizontally. In the mounting position, there is no direct contact between the rollers or sliding elements and the housing, so that deformations of the housing are not transmitted directly to the optical module.

In a further embodiment, the optical module has a vacuum housing component for the vacuum-tight fastening of the optical module to the vacuum housing. When the optical module is in the removal position (or where appropriate in the mounting position), the vacuum housing component, for example in the form of a cover plate, can be fitted to the vacuum housing so that the vacuum housing is closed in a vacuum-tight manner and can be evacuated for operation of the optical arrangement.

The vacuum housing component can be attached to the first carrier body by way of a flexible vacuum element. A corrugated metal expansion bellows (corrugated bellows), for example, can be used as the flexible vacuum element. The flexible connection means that the carrier body of the optical module can be decoupled from the vacuum housing, so that the forces generated by the vacuum and exerted on the vacuum element are not transmitted to the carrier body, or to the optical elements connected thereto. There can be provided on the carrier body an opening for supplying radiation to the optical elements of the optical module, which radiation is generated, for example, by a radiation source (e.g., a laser source) arranged outside the vacuum housing. During the displacement movement of the carrier body, the opening is displaced relative to the vacuum element, which is rigidly connected to the vacuum housing.

In a further embodiment, the first mounting elements have at least one planar bearing surface and the second mounting elements have at least one curved bearing surface, or vice versa. The first mounting element can have a recess for the engagement of bearing surfaces of the second mounting element. The recess can be in the form of an inverted truncated cone, the lateral surface of which has in the circumferential direction a plurality of planar bearing surfaces, which may form a bevel. The base of the truncated cone is polygonal, for example square. As a result of the truncated-cone-like geometry of the recess of the first mounting element, self-centering can take place when the second mounting element engages into the recess of the first mounting element. The second, stationary mounting elements have at least one curved, (e.g., convex, crowned, spherically or ellipsoidally curved) bearing surface. When the first mounting elements move in the movement direction, the curved bearing surface is able to slide along a respective planar bearing surface until the mounting position is reached, in which the bearing surfaces are fixedly arranged relative to one another and are pressed against one another. As a result of the mounting of the curved surface on the planar surfaces of the prismatic recess, the position of the carrier body is statically determined, and the optical module is accordingly reproducibly mounted on the stationary carrier body. In principle, any type of statically determined, or statically over-determined, mounting is possible to achieve the mounting. For example, curved bearing surfaces on the first mounting element and planar bearing surfaces on the second mounting element are also possible.

In a further embodiment, the displacement device has at least one lifting device, or a plurality of lifting devices, for pressing in each case a first mounting element against a second mounting element associated therewith. The lifting devices can act on the underside of the first carrier body (e.g., on the underside of the carrier slide) to lift it from the removal position into the mounting position. For the pressing of the first mounting elements against the second mounting elements, it is advantageous if the lifting devices and the second mounting elements are arranged along a common axis (lifting axis) extending in the movement direction. For example, in the case of a vertical movement direction or lifting axis, the lifting devices can each be positioned in the removal position beneath the second mounting elements. The lifting devices typically act on the underside of the carrier body, more precisely of the carrier slide, by way of linearly displaceable lifting elements. The displaceable lifting elements can be connected to the vacuum housing by way of flexible vacuum elements, for example in the form of expansion bellows. In this manner, the inside of the lifting element can be separated hermetically from the vacuum environment inside the vacuum housing. It will be appreciated that a single lifting device with a flat lifting element may also be provided for lifting the carrier body, which lifting element presses all three (or more) mounting elements of the optical module against the corresponding stationary mounting elements.

In a further embodiment, at least one lifting device has at least one biased spring element. The bias can be used both for effecting the lifting movement on movement of the first carrier body from the removal position into the mounting position, and for applying the contact force in the mounting position. In this manner, it is not necessary to supply energy for holding or pressing the first mounting elements against the second mounting elements during operation of the optical arrangement. To move the carrier body into the removal position, outside energy is applied by an actuator, which outside energy overcomes the bias of the spring elements and displaces a lifting element, which is displaceable in the movement direction, of the lifting device against the force action of the spring elements.

In a further development, at least one lifting device has a pressure chamber to which a pressure medium (a pressure fluid) can be applied to generate a force that opposes the bias of the at least one spring element. By generating a fluid pressure, for example using a compressed gas or a compressed fluid, the bias can be overcome and the spring elements can be compressed further until the mounting elements are no longer in engagement with one another. The spring elements can be in the form of plate springs, to the spring plates of which a fluid pressure can be applied directly to compress them. Preferably, the carrier slide is lowered by the compressed fluid to such an extent that the rollers or wheels and/or sliding elements rest on the support surface in the removal position, so that the optical module can be moved out of the housing in a simple manner.

The at least one optical element of the optical module can be configured for the reflection of laser radiation. The optical module can be designed for the beam guidance of a laser beam (e.g., CO2 laser beam. As discussed above, optical elements which reflect CO2 laser radiation can be arranged in the vicinity of a target position at which a target material is vaporized, because the contamination of the optical surfaces thereof by the target material has a comparatively small influence on the reflectivity thereof. Optical elements for the reflection of CO2 laser radiation can have a metal substrate, for example of copper, which can itself serve as a reflective surface. A reflective coating can be applied to the metal substrate to further increase the reflectivity for laser radiation.

In a further embodiment, the at least one further optical element attached to the second carrier body is configured for the reflection of EUV radiation. The further optical element can be in particular a so-called collector mirror for the EUV radiation generated at the target position by the irradiation of the target material. To reflect EUV radiation, a multi-layer coating is typically applied to the optical element, which coating has a plurality of alternating layers of alternately high and low refractive index.

It will be appreciated that optical elements attached to the first or second carrier body do not necessarily have to be configured as reflective optical elements but may also be configured as transmitting optical elements. That is the case when the optical elements are configured for the transmission or reflection of radiation in different wavelength ranges than the EUV wavelength range (i.e., at wavelengths between about 5 nm and about 50 nm) or in the infrared (IR) wavelength range (e.g., at 10.6 micrometers). It is also possible to provide optical elements on the optical module that transmit in the IR wavelength range, for example optical elements of zinc selenide.

This disclosure relates also to an optical module for an optical arrangement as described above, comprising: a carrier body to which there are attached at least one, e.g., reflective, optical element and a plurality of first mounting elements, wherein the carrier body has a carrier slide having a plurality of rollers and/or sliding elements for the removal of the optical module from a housing, e.g., from a vacuum housing. The use of the carrier slide, or of the rollers/sliding elements, enables the displacement of the optical module from/to the removal position to be facilitated. The optical elements are typically connected rigidly to the carrier body so that, as a result of a defined mounting of the carrier body, the optical elements can also be arranged in a defined position.

In a further embodiment, the optical module comprises a vacuum housing component for the vacuum-tight fastening of the optical module to the vacuum housing. The vacuum housing component can be in plate form, for example, and is typically fastened at its peripheral edge to the vacuum housing in a tight manner. In an advantageous further development, the vacuum housing component is attached to the carrier body by way of a flexible vacuum element, for example an expansion bellows. In this manner, the vacuum housing component can be displaced relative to the carrier body to displace the carrier body in the fitted state between the removal position and the mounting position.

This disclosure relates also to a method for correctly positioning an optical module in a housing of an optical arrangement as described above, which method comprises the following steps: moving the carrier body of the optical module from an access position to a removal position in the housing, and moving the carrier body of the optical module from the removal position into the mounting position, in which the first mounting elements are pressed against the second mounting elements. Typically, after the optical module or the carrier body has been moved from the access position into the removal position or the mounting position, the vacuum housing component is connected to the vacuum housing to allow the vacuum housing to be evacuated for operation of the optical arrangement.

In a variant of the method, to move the carrier body from the access position into the removal position, the carrier slide of the optical module is displaced (e.g., by rolling and/or sliding) along a support surface of the housing. To facilitate the displacement along the support surface, the carrier body can have a carrier slide provided with rollers and/or sliding elements, as described above.

Further advantages of the invention will become apparent from the description and the drawings. Likewise, the features mentioned above and those set out hereinbelow can be used individually or in arbitrary combinations of a plurality thereof. The embodiments shown and described are not to be interpreted as an exhaustive enumeration but instead are of an exemplary nature to illustrate the invention.

DESCRIPTION OF DRAWINGS

FIG. 1 shows a schematic representation of an optical module of an optical arrangement for use in a vacuum housing in the form of a beam-generating system of an EUV lithography installation;

FIG. 2 shows a schematic representation of the optical module of FIG. 1 in the fitted state in the vacuum housing;

FIG. 3a shows a housing section of the vacuum housing with a carrier slide of the optical module in an access position at a distance from the vacuum housing;

FIG. 3b shows a housing section of the vacuum housing with a carrier slide of the optical module in an access position inside the vacuum housing;

FIG. 4a shows a section of the vacuum housing with three lifting devices for lifting the carrier body of the optical module into a mounting position;

FIG. 4b shows a carrier body for a collector mirror having three mounting elements which in the mounting position are brought into engagement with three mounting elements of the optical module;

DETAILED DESCRIPTION

Figure 5A:
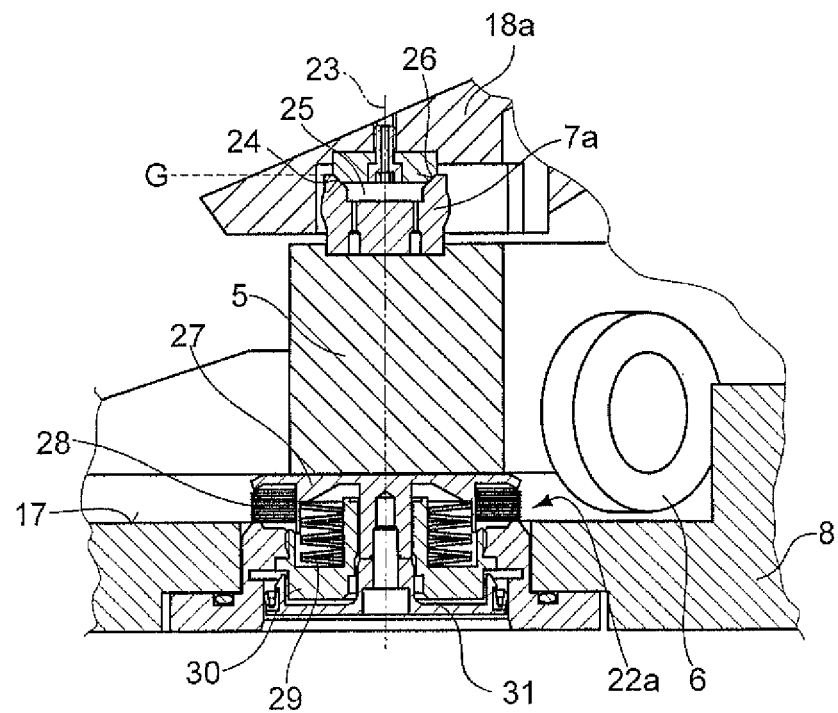
FIG. 5a shows a lifting device with the carrier slide of the optical module in the mounting position.

FIG. 1 shows an optical module 1 for the beam guidance of a CO2 laser beam 2 which enters the optical module 1 at a beam entry opening 3. The optical module 1 has a rigid carrier body 4 which includes a carrier slide 5 and a carrier element 5a (carrier frame). In the present example, four rollers 6 are attached to the carrier slide 5 to permit a rolling movement of the optical module 1 in a typically horizontal movement direction. The attachment of sliding elements, for example runners, to the carrier slide 5 is also possible. Three mounting elements 7a-c are also attached to the carrier body 4, more precisely to the carrier slide 5, for positioning the optical module 1 correctly in a housing 8 shown in FIG. 2.

For the beam guidance of the laser beam 2, the optical module 1 has three optical elements 9, 10, 11, of which the first and second optical elements 9, 10 are concealed by the carrier body 4 in the representation shown in FIG. 1. The first and second optical elements 9, 10 serve to focus the laser beam 2 on a target position (not shown in greater detail), on which there is provided a target material, in the present case tin, which is converted to a plasma state when irradiated with the laser beam 2 and thereby emits EUV radiation. The third optical element is a plane mirror 11 for deflecting the focused laser beam 2 towards the target position. On irradiation with the laser beam 2, a portion of the target material is vaporized and can be deposited on the optical surfaces of the optical elements 9, 10, 11 arranged in the vicinity of the target position. For example, that may be the case with the optical surface 11a of the plane mirror 11 shown in FIG. 1, which of the three optical elements 9, 10, 11 is at the smallest distance from the target position.

FIG. 2 shows the optical module 1 in a fitted state in a housing 8 of an optical arrangement 12 in the form of a beam-generation system for generating EUV radiation. To minimize the absorption by gaseous substances of the generated EUV radiation, the housing 8 is in the form of a vacuum housing and can be evacuated by a pump device (not shown). To close the vacuum housing 8 with the inserted module 1 in a vacuum-tight manner, a vacuum housing component in the form of a cover plate 13 (shown in FIG. 2) is attached to the optical module 1 and is connected in a vacuum-tight manner to the vacuum housing 8. Screw connections (not shown) and corresponding seals, which extend along the outside edge of the cover plate 13, serve to connect the cover plate 13 in a vacuum-tight manner to the vacuum housing 8.

The cover plate 13 is connected to the carrier body 4 by way of a metal expansion bellows 14 (indicated in FIG. 2), which serves as a flexible vacuum housing component and allows the carrier body 4 to move relative to the vacuum housing 8 even after the cover plate 13 has been fixed. Such a movement is necessary to move the optical module 1 integrated into the vacuum housing 8 from a removal position into a mounting position, as will be discussed in greater detail below. Also shown in FIG. 2 is a process chamber 15 in which there is accommodated a collector mirror 16, indicated by an arrow, for capturing EUV radiation coming from the target position.

To clean the optical surfaces of the optical elements 9, 10, 11 or to replace one or more of the optical elements 9, 10, 11 the optical module 1 can be removed from the housing 8 by releasing the connection of the cover plate 13 to the vacuum housing 8 and removing the optical module 1 from the vacuum housing 8.

For the removal and re-positioning of the optical module 1 in the vacuum housing 8, the optical module 1 can be displaced along a planar, horizontal support surface 17 which is provided on the vacuum housing 8 and is shown in FIG. 3a, b. For simplification, FIG. 3a shows only the carrier slide 5 with the rollers 6 in an access position B, that is to say a position at a distance from the housing 8, in which maintenance can be carried out, while FIG. 3b shows the carrier slide 5 inserted into the housing 8 in a position in which it can be integrated by the cover plate 13 into the vacuum housing 8, more precisely into a wedge-shaped section thereof.

To displace the carrier slide 5 from the position shown in FIG. 3a into the position shown in FIG. 3b (and back), auxiliary surfaces (not shown) can be provided, which allow the carrier slide 5, or the optical module 1, to move as horizontally as possible. A planar support plate, for example, can be provided as an auxiliary surface, the upper side of which is aligned with the support surface 17 of the vacuum housing 8. Additional supporting rollers can also be attached to the carrier slide 5 for taking the weight thereof. Guide rails can also be used to facilitate the displacement of the optical module 1.

In the position of the carrier slide 5 shown in FIG. 3b, the mounting elements 7a-c are located vertically beneath mounting elements 18a-c, which are attached to a carrier plate 19 shown in FIG. 4b which serves as the carrier body for the collector mirror 16. Attached to the carrier plate 19, at the edge of a through-opening for the laser radiation and in the vicinity of the mounting elements 18a-c, are three mounting points 20a-c for holding the collector mirror 16. The relative proximity of the mounting points 20a-c to the mounting elements 18a-c for the optical module 1 improves the dynamic and static rigidity.

The upper side of the section of the vacuum housing 8 shown in FIG. 4a is fastened to the carrier plate 19 shown in FIG. 4b and fixedly connected thereto. The carrier plate 19, and accordingly the mounting elements 18a-c, 20a-c attached thereto, are a stationary part of the beam-forming system 12, relative to which the optical elements 9, 10, 11 must be positioned correctly on integration into the beam-forming system 12.

Figure 5B:
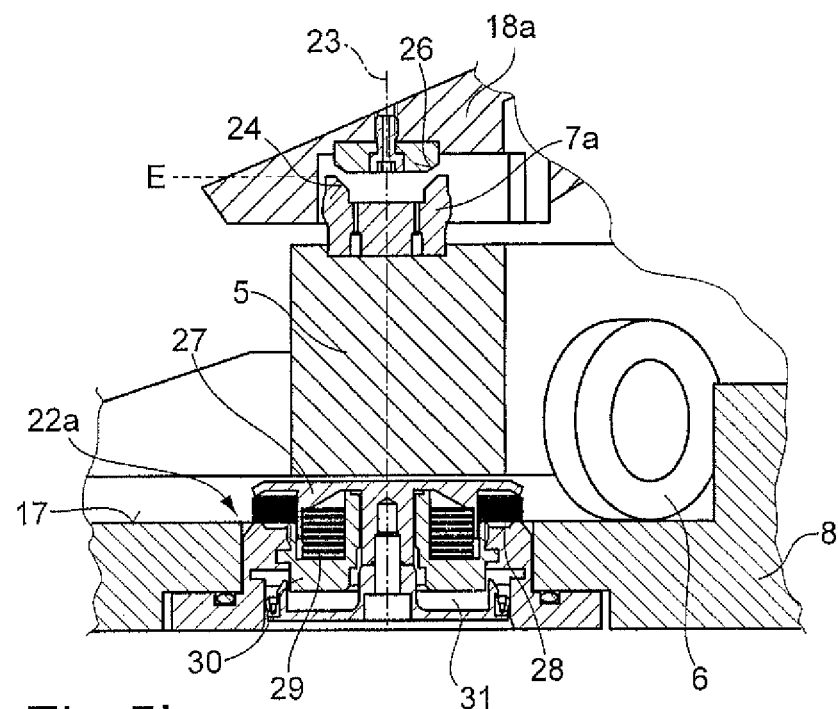
FIG. 5b shows a lifting device with the carrier slide of the optical module in the removal position.

To orient the optical module 1 correctly, or more precisely the optical elements 9, 10, 11, relative to the carrier plate 19 (and accordingly to the collector mirror 16), a movement device 21 is provided on the beam-forming system 12, which movement device 21 has three lifting devices 22a-c for moving the carrier body 4 of the optical module 1 to and fro along a lifting axis 23 extending in a vertical direction, between a mounting position G, which is shown in FIG. 5a, and a removal position E, which is shown in FIG. 5b. In the removal position E shown in FIG. 5b, the optical module 1 can be removed from the vacuum housing 8 in the manner described above.

In the mounting position G shown in FIG. 5a, the three mounting elements 7a-c of the optical module 1 are pressed against the force of gravity against an associated mounting element 18a-c of the carrier plate 19 (not shown in FIG. 5a), as is shown in FIG. 5a by a first pair 7a, 18a of mounting elements. To ensure a high degree of precision of the mounting, the first mounting elements 7a-c each have two planar bearing surfaces 24, which form the edge or bevel of a recess 25 which is in the (prismatic) form of a (an inverted) truncated cone having a square base. A peripheral, spherically curved bearing surface 26 is formed on the mounting elements 18a-c of the carrier plate 19. In the mounting position G, the planar bearing surfaces 24 of the mounting elements 7a-c of the optical module 1 abut the spherical bearing surface 26 of the mounting elements 18a-c of the carrier plate 19. In the mounting position G, the bearing surfaces 24 of the mounting elements 7a-c of the optical module 1 are pressed by the lifting devices 22a-c against the mounting elements 18a-c of the carrier plate 19. To effect pressing, a lifting element 27 of the lifting device 22a-c in question is pressed against the underside of the carrier slide 5.

The accuracy of the mounting of the carrier body 4 that is achieved by the spherical bearing surface 26 and the prismatic arrangement of the planar bearing surfaces 24 is within the micrometer range. Such accuracy is sufficient to render additional adjustment of the carrier body 4, or of the carrier slide 5, relative to the carrier plate 19 unnecessary when orienting the optical elements 9, 10, 11 of the optical module 1 relative to the stationary optical elements (e.g., relative to the collector mirror 16).

As can likewise be seen in FIG. 5a, the rollers or wheels 6 of the carrier slide 5 are lifted off the support surface 17 in the mounting position G. The lifting element 27 of the lifting device 22a-c is displaceable along the lifting axis 23 and presses against the underside of the carrier slide 5, is attached to the vacuum housing 8 by way of a flexible vacuum element 28, which is likewise in the form of expansion bellows. The flexible vacuum element 28 serves as a vacuum seal with respect to the surroundings.

To hold the carrier slide 5 in the mounting position G shown in FIG. 5a, a biased plate spring 29 is provided in the lifting devices 22a-c between a stationary base body 30 and the lifting element 27. To move the lifting element 27 (and accordingly the carrier slide 5) from the mounting position G shown in FIG. 5a into the removal position E shown in FIG. 5b in which the rollers 6 of the carrier slide 5 rest on the support surface 17, an actuator is used, which actuator is part of the movement device 21.

For the downwards displacement of the lifting device 27, a pressure medium, in the present example compressed air, is introduced into a pressure chamber 31 formed in the lifting devices 22a-c. The pressure medium exerts a force on the upper side of the plate springs 29, which force is sufficiently great to compress the plate springs 29 to such an extent that a gap is formed between the underside of the carrier slide 5 and the lifting element 27, so that the carrier slide 5 is no longer supported by the lifting devices 22a-c and the rollers 6 rest on the support surface 17. Correspondingly, the mounting elements 7a-c, 18a-c are also no longer in engagement with one another in the removal position E, so that the optical module 1 can be rolled along the support surface 17 and out of the vacuum housing 8.

On lowering of the carrier body 4, a pressure medium is typically applied to the pressure chambers 31 of the three lifting devices 22a-c in succession. This is possible because the movement path along the lifting axis 23 is generally in the region of a few millimeters, so that there is no risk of the optical module 1 becoming wedged in the vacuum housing 8 if a skewed position is thereby effected. It will be appreciated that a pressure medium may be applied to all three pressure chambers 31 of the lifting devices 22a-c simultaneously (in a controlled manner) to bring about synchronous lowering of the lifting elements 27 of the three lifting devices 22a-c and accordingly lowering of the carrier slide 5 parallel to the support surface 17. The pressure medium is supplied to the pressure chamber 31 by way of a radial bore.

In the removal position E, the optical module 1 can be removed from the vacuum housing 8 in a simple manner despite the small amount of space available, for example to replace one of the optical elements 9, 10, 11 with another. In the mounting position G, reproducible mounting, or orientation, of the optical elements 9, 10, 11 is made possible without additional adjustment being necessary for that purpose.

A number of embodiments of the invention have been described. Nevertheless, it will be understood that various modifications may be made without departing from the spirit and scope of the invention. Accordingly, other embodiments are within the scope of the following claims.

What is claimed is:

1. An optical arrangement comprising:
   an optical module having a first carrier body to which there are attached at least one optical element for the beam guidance of a laser beam, and a plurality of first mounting elements;
   a vacuum housing having fixedly connected thereto a second carrier body for at least one further optical element, wherein the second carrier body is stationary with respect to the vacuum housing and wherein a plurality of second mounting elements are attached to the second carrier body; and
   a movement device for displacing the first carrier body relative to the second carrier body in a movement direction between a removal position from which the optical module can be removed from the vacuum housing and a mounting position in which the movement device presses the first mounting elements against the second mounting elements.

2. The optical arrangement according to claim 1, wherein the at least one optical element and/or the further optical element are reflective elements.

3. The optical arrangement according to claim 2, wherein the at least one optical element of the optical module is configured for the reflection of laser radiation.

4. The optical arrangement according to claim 2, wherein the at least one further optical element is configured for the reflection of EUV radiation.

5. The optical arrangement according to claim 1, wherein the optical module has a vacuum housing component for the vacuum-tight fastening of the optical module to the vacuum housing.

6. The optical arrangement according to claim 5, wherein the vacuum housing component is attached to the first carrier body by way of a flexible vacuum element.

7. The optical arrangement according to claim 1, wherein the movement device displaces the first carrier body relative to the second carrier body in a vertical movement direction.

8. The optical arrangement according to claim 1, wherein the carrier body comprises a carrier slide which has a plurality of rollers and/or sliding elements.

9. The optical arrangement according to claim 8, wherein the rollers and/or the sliding elements rest on a support surface on the vacuum housing in the removal position and are at a distance from the support surface in the mounting position.

10. The optical arrangement according to claim 1, wherein the first mounting elements have at least one planar bearing surface and the second mounting elements have at least one curved bearing surface, or vice versa.

11. The optical arrangement according to claim 1, wherein the movement device comprises at least one lifting device for pressing in each case a first mounting element against a second mounting element associated therewith.

12. The optical arrangement according to claim 11, wherein at least one lifting device has at least one biased spring element.

13. The optical arrangement according to claim 12, wherein at least one lifting device has a pressure chamber to which a pressure medium can be applied to generate a force that opposes the bias of the at least one spring element.

14. A method for correctly positioning an optical module in a housing of an optical arrangement according to claim 1, comprising:
   moving the first carrier body of the optical module from an access position to a removal position in the vacuum housing, and
   moving the first carrier body of the optical module from the removal position into the mounting position, in which the first mounting elements are pressed against the second mounting elements.

15. The method according to claim 14, wherein the carrier slide of the optical module is displaced along a support surface of the housing to move the first carrier body from the access position into the removal position.

* * * * *